United States Patent

McNeely

(10) Patent No.: US 7,123,652 B1
(45) Date of Patent: Oct. 17, 2006

(54) SAMPLED DATA DIGITAL FILTERING SYSTEM

(75) Inventor: David Lowell McNeely, Indianapolis, IN (US)

(73) Assignee: Thomson Licensing S.A., Boulogne-Billancourt (FR)

( * ) Notice: Subject to any disclaimer, the term of this patent is extended or adjusted under 35 U.S.C. 154(b) by 0 days.

(21) Appl. No.: 09/415,654

(22) Filed: Oct. 12, 1999

Related U.S. Application Data

(60) Provisional application No. 60/121,198, filed on Feb. 24, 1999.

(51) Int. Cl.
*H03K 5/159* (2006.01)
*H03M 7/00* (2006.01)

(52) U.S. Cl. ................................ 375/232; 341/123

(58) Field of Classification Search ............ 358/21–40; 341/104; 345/154; 375/232, 321–326, 240, 375/316; 364/725; 382/250; 708/203–402
See application file for complete search history.

(56) References Cited

U.S. PATENT DOCUMENTS

| | | | | |
|---|---|---|---|---|
| 3,656,064 A | * | 4/1972 | Giles et al. ................. 329/303 |
| 3,754,128 A | * | 8/1973 | Corinthios .................. 708/400 |
| 4,524,423 A | * | 6/1985 | Acampora .................. 348/663 |
| 4,745,462 A | | 5/1988 | Dischert et al. .......... 358/21 R |
| 5,016,207 A | * | 5/1991 | Fujii et al. .................. 708/300 |
| 5,223,920 A | * | 6/1993 | Srivastava .................. 348/605 |
| 5,535,150 A | * | 7/1996 | Chiang ........................ 708/322 |
| 5,694,474 A | | 12/1997 | Ngo et al. ..................... 381/66 |
| 5,784,378 A | | 7/1998 | Murray et al. .............. 370/498 |
| 5,841,473 A | | 11/1998 | Chui et al. .................. 348/390 |
| 5,909,254 A | * | 6/1999 | Feig et al. ................... 348/660 |
| 5,913,186 A | | 6/1999 | Byrnes et al. ............... 704/204 |
| 5,957,998 A | * | 9/1999 | Ozaki .......................... 382/250 |
| 6,266,380 B1 | * | 7/2001 | Wang ........................... 375/319 |
| 6,295,322 B1 | * | 9/2001 | Arbeiter et al. ........ 375/240.29 |
| 6,356,598 B1 | * | 3/2002 | Wang ........................... 348/725 |

OTHER PUBLICATIONS

Floyd M. Gardner, *Interpolation in Digital Modems—Part I: Fundamentals*, IEEE Transactions on Communications, vol. 41, No. 3, Mar. 1993, US.

Lars Erup, Floyd M. Gardner and Robert A. Harris, *Interpolation in Digital Modems—Part II: Implementation and Performance*, IEEE Transactions on Communications, vol. 41, No. 6, Jun., 1993.

"Mirror–Image Symmetric Perfect–Reconstruction FIR Filter Banks: Parametrization and Design", Kofidis E. et al., Signal Processing, Amsterdam, NL, vol. 68, No. 1, Jul. 20, 1998, pp. 1–21.

(Continued)

*Primary Examiner*—Stephen Chin
*Assistant Examiner*—Lawrence Williams
(74) *Attorney, Agent, or Firm*—Joseph J. Laks; Ronald H. Kurdyla; Jeffrey M. Navon

(57) ABSTRACT

A digital filtering system for filtering sample data includes a delay network for delaying input sample data to provide multiple delayed sample data outputs. The filtering system also includes a filter network represented by a decomposed coefficient weighting matrix for processing the delayed sample data outputs. A processor produces a filtered output by computing a weighted product summation of the delayed sample data outputs and the coefficient weighting matrix. The decomposed coefficient weighting matrix is derived by factoring a first coefficient weighting matrix with a common row factor and/or sparse matrix or by factoring based on matrix row or column symmetry.

17 Claims, 6 Drawing Sheets

OTHER PUBLICATIONS

"A Generalized Structural Subband Decomposition of FIR Filters and its Application in Efficient FIR Filter Design and Implementation", Sanjit K. Mitra et al., IEEE Transactions on Circuits and Systems II: Analog and Digital Signal Processing, IEEE Inc., New York, US, vol. 40 No. 6, Jun. 1, 1993, pp. 363–374.

"Pre–Intrepolation Filters for Upsampling", Miao, G. J. et al., Motorola Technical Developments, Motorola Inc., Schaumburg, Illinois, US , vol. 34, Mar. 1, 1998, pp. 141–144.

"Adaptive FIR Filter Structure Based on the Generalized Subband Decomposition of FIR Filters", Petraglio, M. R. et al., IEEE Transactions on circuits and systems II: Analog and Digital Signal Processing, IEEE Inc., New York, US, vol. 40, No. 6, Jun. 1, 1993, pp. 354–362.

(European Search Report dated Jan. 28, 2002 & Chinese Office Action dated Mar. 2, 2004, both enclosed.).

* cited by examiner

| POSITION INDEX | DELAY | $1$ | $z^{-0.5}$ | $z^{-1}$ | $z^{-1.5}$ |
|---|---|---|---|---|---|
| 0 | 48/32 | 0 | 0 | 768 | 0 |
| 1 | 47/32 | -15 | 63 | 735 | -15 |
| 2 | 46/32 | -28 | 124 | 700 | -28 |
| 3 | 45/32 | -39 | 183 | 663 | -39 |
| 4 | 44/32 | -48 | 240 | 624 | -48 |
| 5 | 43/32 | -55 | 295 | 583 | -55 |
| 6 | 42/32 | -60 | 348 | 540 | -60 |
| 7 | 41/32 | -63 | 399 | 495 | -63 |
| 8 | 40/32 | -64 | 448 | 448 | -64 |
| 9 | 39/32 | -63 | 495 | 399 | -63 |
| 10 | 38/32 | -60 | 540 | 348 | -60 |
| 11 | 37/32 | -55 | 583 | 295 | -55 |
| 12 | 36/32 | -48 | 624 | 240 | -48 |
| 13 | 35/32 | -39 | 663 | 183 | -39 |
| 14 | 34/32 | -28 | 700 | 124 | -28 |
| 15 | 33/32 | -15 | 735 | 63 | -15 |
| 16 | 32/32 | 0 | 0 | 768 | 0 |
| 17 | 31/32 | -15 | 63 | 735 | -15 |
| 18 | 30/32 | -28 | 124 | 700 | -28 |
| 19 | 29/32 | -39 | 183 | 663 | -39 |
| 20 | 28/32 | -48 | 240 | 624 | -48 |
| 21 | 27/32 | -55 | 295 | 583 | -55 |
| 22 | 26/32 | -60 | 348 | 540 | -60 |
| 23 | 25/32 | -63 | 399 | 495 | -63 |
| 24 | 24/32 | -64 | 448 | 448 | -64 |
| 25 | 23/32 | -63 | 495 | 399 | -63 |
| 26 | 22/32 | -60 | 540 | 348 | -60 |
| 27 | 21/32 | -55 | 583 | 295 | -55 |
| 28 | 20/32 | -48 | 624 | 240 | -48 |
| 29 | 19/32 | -39 | 663 | 183 | -39 |
| 30 | 18/32 | -28 | 700 | 124 | -28 |
| 31 | 17/32 | -15 | 735 | 63 | -15 |

FIG. 4

SAMPLED DATA DIGITAL FILTERING SYSTEM

This is a non-provisional application of provisional application Ser. No. 60/121,198 by D. McNeely, filed Feb. 24, 1999.

FIELD OF THE INVENTION

This invention is related to the sample rate conversion of digital data for data processing applications including video and audio among others.

BACKGROUND OF THE INVENTION

There are a variety of applications requiring conversion of digital data samples occurring at a first data rate to digital data samples occurring at a different second data rate. In these applications, data sampled at one rate is interpolated to provide estimates of data at a different rate or sampling phase. Sample rate conversion applications include, for example, conversion between different video standards such as between High Definition TV (HDTV) data and CCIR601 standard data and conversion between different video display formats such as between interlace and progressive display formats. Other applications include, for example, multi-media composite image formation and display e.g. for Picture-in-Picture (PIP) presentation, and data processing for digital data storage such as for CDROM or DVD applications and digital demodulation involving digital sample rate conversion for establishing frequency, phase or symbol timing synchronization. The widespread use of sample rate conversion in cost sensitive applications means that there is a need to optimize configurations for both sample rate converters and their interpolator and digital filter sub-components.

Known, classical interpolator configurations have been thought to be optimal in terms of maximizing performance and minimizing the hardware complexity involved, i.e., the numbers of adders, multipliers, registers etc. that are used. However, the sample rate converter, interpolator and digital filter systems and the methods of their derivation presented herein provide improvements over the known filter designs in both performance and reduced complexity.

SUMMARY OF THE INVENTION

A digital filtering system for filtering sample data includes a delay network for delaying input sample data to provide multiple delayed sample data outputs. The filtering system also includes a filter network representable by a decomposed (structurally factored) coefficient weighting matrix for processing the delayed sample data outputs. A processor produces a filtered output by computing a weighted product summation of the delayed sample data outputs and the coefficient weighting matrix.

BRIEF DESCRIPTION OF THE DRAWINGS

In the Drawing

FIG. 4 shows a table indicating coefficient values and the effective filter delay in conjunction with the corresponding position index signal for the reduced complexity digital filter of unit 40 of FIG. 3.

DETAILED DESCRIPTION OF THE DRAWINGS

Figure 1:
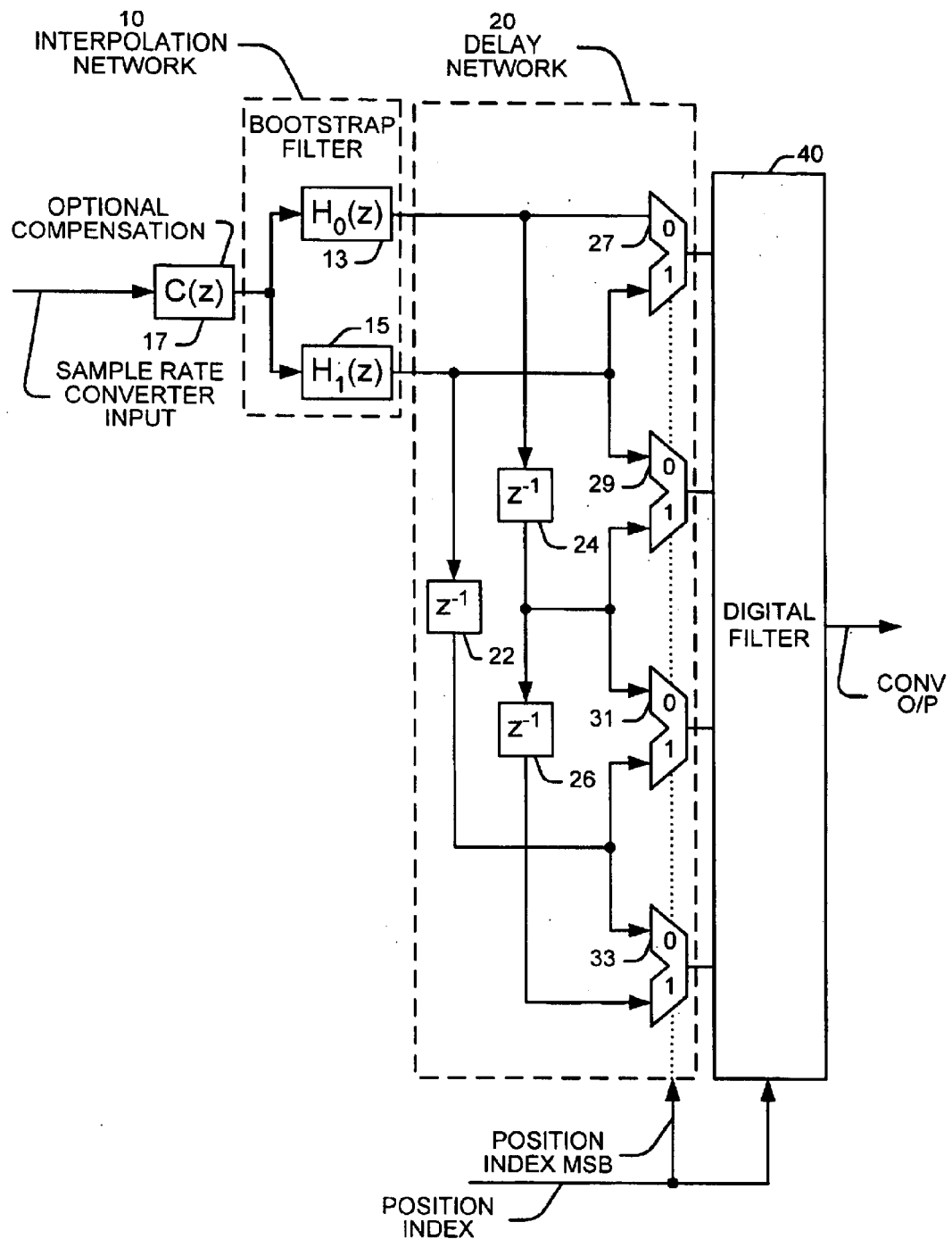
FIG. 1 shows an enhanced performance sample rate converter for converting the horizontal line sample rate of luminance and chrominance data samples in a video display format conversion application, according to the principles of the invention.

FIG. 1 shows an enhanced performance sample rate converter for converting the horizontal line sample rate of luminance and chrominance data samples in a video display format conversion application. Although the disclosed converter is described in the context of a system for processing video signals for display format conversion purposes e.g. to upsample a standard definition format of 720×1280 pixel resolution to a high definition format of 1080×1920 pixel resolution (or vice versa), it is exemplary only. The converter and digital filter configurations and inventive principles disclosed may be used for any filtering or sample rate converter application including either upsampling or downsampling conversions.

In overview, the sample rate converter system of FIG. 1 comprises compensation pre-filter 17, interpolation network 10, delay network 20 and digital filter 40. Pre-filter 17 is optional and used to optimize performance in terms of noise rejection outside of the desired passband and gain within the desired passband in the high performance system of FIG. 1. In contrast, in a reduced complexity sample rate converter system (described later in connection with FIG. 3), pre-filter 17 is omitted.

A sample rate converter converts data at an input sample rate to data at a different output sample rate and possesses a number of mutually dependent properties. These include, for example, gain and phase response characteristics, phase delay, group delay, and clock delay. In order to achieve a desired sample rate converter performance and to tailor converter operation for a particular application, it is necessary to select an acceptable compromise between these properties, both for the converter as a whole and for intermediate processing stages within the converter. In deriving a sample rate converter configuration, individual selected properties may be established as either invariant properties or as properties to be optimized.

Important objectives in sample rate converter design are: 1) maximizing performance including minimizing alias (i.e. interference) components in the Pass Band, and 2) minimizing complexity (e.g. measured in the number of adders required for an implementation). Normally performance and complexity are inversely related in sample rate converter design. However, by viewing a sample rate converter system as being equivalent to a multi-stage interpolator comprising a sequence of cascaded interpolators, an advantageous sample rate converter configuration is derived offering reduced complexity and improved performance over previously deemed optimal arrangements. In such a multi-stage interpolator, a first "coarse" interpolator stage converts a spatial sampling grid of an input signal to a higher resolution spatial sampling grid (a "coarse" up-sample grid). A second "finer" resolution interpolator stage converts the coarse up-sample grid to a spatial sampling grid of desired resolution. A conventional implementation of this concept would require three clock domains representing the input sample rate, an intermediate re-sampled rate and the desired output re-sampled rate. The sample rate converter system disclosed herein and exemplified in FIG. 1 provides data at the desired output sample rate whilst advantageously:

1. processing data at a reduced number of data rates, specifically at two data rates (the input sample rate and the desired output sample rate), and
2. maximizing the proportion of circuitry operating at the input sample rate (input sample rate is less than the output sample rate for an upsample application and greater than the output sample rate for a down-sample application).

These important benefits are achieved by employing advantageous sample rate converter architectures that merge and integrate the coarse and fine interpolator stages of the multi-stage interpolator. Such an advantageous architecture is exemplified by the compensation pre-filter 17, interpolation network 10, delay network 20 and digital filter 40 of FIG. 1. In such an improved converter architecture a second "finer" resolution interpolator stage is chosen to have a reduced number of intermediate delay stages (taps) with a larger number of sets of digital filter weighting coefficients than is typical for an equivalent conventional converter architecture. Note, each digital filter weighting coefficient is associated with an intermediate delay stage. The "coarse" first stage interpolator is chosen to have a larger number of intermediate delay stages (taps) with a lower number of sets of digital filter weighting coefficients than is typical for an equivalent conventional converter architecture.

An improved converter architecture using an integrated multi-stage interpolator according to invention principles includes:

1. A second stage interpolator (exemplified by digital filter 40 of FIG. 1) of finer resolution than a first stage interpolator (units 10 and 20 of FIG. 1) that is configured to isolate its tapped delay line which comprises multiple intermediate delay stages.
2. A generalized tapped delay line (exemplified by interpolation network 10 in conjunction with delay network 20 of FIG. 1) replacing the isolated tapped delay line of the second stage interpolator. This generalized tapped delay line is clocked at the input sample rate and consists of intermediate delay stages (taps) with a larger number of sets of digital filter weighting coefficients than is typical for an equivalent conventional converter architecture. The generalized tapped delay line includes:

a) a first interpolation network (unit 10 of FIG. 1 comprising a temporal bootstrap filter), for interpolating data at a first sample rate to provide upsampled interpolated data samples according to a first sample spacing and having one input and n outputs, b) multiple tapped delay lines (units 22, 24 and 26 of delay network 20 of FIG. 1) comprising a delay network providing delayed upsampled interpolated data samples according to a second sample spacing of higher resolution than the first sample spacing. Sets of delayed upsampled interpolated data samples encompass (i.e. precede and succeed) a corresponding original sample position, and c) a multiplexer network (units 27, 29, 31 and 33 of delay network 20 of FIG. 1) providing multiple $$\frac{T}{n}$$

spaced delay line outputs (taps) comprising higher resolution second sample spacing data surrounding the desired output sample time, where T is the period between samples of the input sampled rate and n, in the converter architecture of FIG. 1, is 2.

In considering the operation of the sample rate converter of FIG. 1 in detail, a pre-filtered compensated input signal is provided by unit 17 to units 13 and 15 of interpolation network 10. The signal provided by unit 17 is filtered with a transfer function selected to optimize overall passband performance of the FIG. 1 converter in terms of providing noise rejection outside of the passband and to provide an optimized (i.e. ideally flat) gain response within the passband. Units 13 and 15 of network 10 process the data from unit 17 and provide upsampled data to delay network 20. Specifically, units 13 and 15 interpolate the input data from unit 17 with transfer functions $H_0(z)$ and $H_1(z)$ respectively and provide interpolated data outputs to delay network 20. Unit 13 ($H_0(z)$) in the embodiment of FIG. 1, merely passes the original pre-filtered data from unit 17 to delay network 20 i.e. $H_0(z)$ in the embodiment of FIG. 1 is a delay function. Unit 15 ($H_1(z)$) in the embodiment of FIG. 1 interpolates the sampled data from unit 17 to provide intervening data samples intermediate between the input samples from unit 17. Therefore, the two outputs provided by units 13 and 15 together comprise data representative of the pre-filtered input data upsampled by a factor of two. In other embodiments units 13 and 15 provide interpolated data, that is upsampled or downsampled by the desired sampling factor, to delay network 20 which may employ transfer functions that are either the same, or different, as desired.

The data from unit 13 of interpolation network 10 is provided to multiplexer 33 via both delays 24 and 26 and to multiplexer 27 [via delay 24] and also to multiplexers 29 and 31 via delays 24 and 26. The data from unit 15 of interpolation network 10 is provided to multiplexers 31 and 33 via delay 22 and to multiplexers 27 and 29. In this configuration, units 22, 24 and 26 of network 20 comprise multiple tapped delay lines providing outputs of delayed upsampled interpolated data samples of higher resolution than the sample spacing of the input data from unit 17. Multiplexers 27, 29, 31 and 33 multiplex the inputs received from units 10, 22, 24 and 26 to provide a selected set (selected from between two available sets) of upsampled delayed samples to digital filter 40.

Multiplexers 27, 29, 31 and 33 multiplex between the two sets of upsampled delayed inputs from units 10, 22, 24 and 26 in response to a position representative selection signal identifying the upsampled delayed output sample set spatially encompassing (i.e. straddling) the corresponding position of the converter output sample whose value is currently being determined by the sample rate converter system of FIG. 1. Specifically, this selection signal identifies and selects the set of four upsampled delayed output samples comprising the two upsampled delayed output samples located either side of the corresponding output sample being determined by the FIG. 1 converter system. In the configuration of FIG. 1, the selection signal input to multiplexers 27, 29, 31 and 33 comprises the MSB (most significant bit) of a position index signal used by filter 40 to spatially interpolate between two input samples being processed.

The set of four upsampled delayed output samples provided by network 20 to digital filter 40 consist of multiple $$\frac{T}{n}$$

spaced delay line outputs (taps) comprising higher resolution second sample spacing data surrounding the output sample time desired (where T is the period between samples of the input sample data from unit 17 and n is 2 in the architecture of FIG. 1).

Other architectures with other values of n may be derived by replacing an isolated tapped delay line with the advantageous generalized delay line arrangement in accordance with the invention principles. For example, in the arrangement of FIG. 5 (discussed later), the generalized delay line of FIG. 1 is extrapolated to provide n=3. Further, the use of the generalized delay line configuration of FIG. 1 facilitates the processing of the input sample data at a single 20 to process input data at the input sample rate. The use of the generalized delay line maximizes the proportion of converter system circuitry operating at the input sample rate and allows a concomitant reduction in the quantity of converter circuitry that is required to implement the sample rate conversion function (in comparison to a conventional approach). Further, the use of the generalized delay line arrangement advantageously enables the processing of data in the converter of FIG. 1 at two data rates, specifically at the input sample rate and at the desired output sample rate.

The sets of four upsampled delayed output samples provided by network 20 to the second stage fine resolution interpolator of digital filter 40 are interpolated by filter 40 to provide sample data at the desired output sample rate. In providing the output sample data at the desired output sample rate, unit 40 processes the upsampled delayed output sample sets from unit 20 together with a spatial position index signal used by filter 40 to spatially interpolate between two input samples being processed.

Figure 1A:
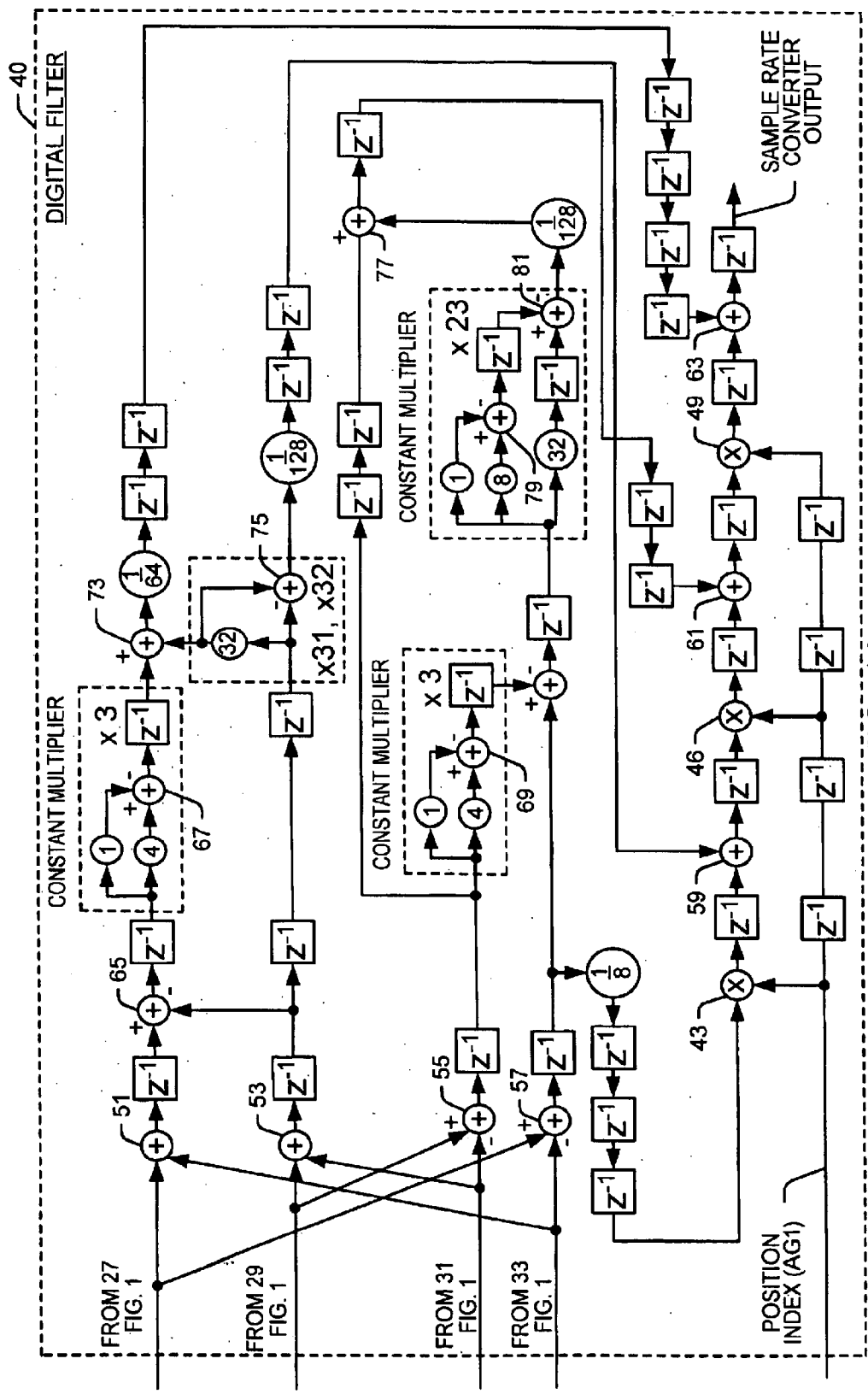
FIG. 1A shows an enhanced performance digital filter for use as digital filter 40 in the sample rate converter configuration of FIG. 1, according to the principles of the invention.

FIG. 1A shows the structure of an exemplary enhanced performance digital filter for use as digital filter 40 in the sample rate converter configuration of FIG. 1. Filter 40 (FIG. 1A) advantageously implements a fine resolution second stage interpolation function with reduced circuitry (i.e. a reduced number of adders). The interpolation function performed by filter 40 is derived using an advantageous method of mathematically structuring and factoring the desired filter function into a minimized logic implementation. This advantageous filter function derivation method is arrived at from the consideration that a sample rate converter system may be viewed as comprising a pre-filter, a sample rate converter and a post-filter in a cascade that possesses inter-related characteristics. These characteristics include, for example, gain and phase response characteristics, phase delay, group delay, and clock delay for the converter as a whole and for intermediate processing stages within the converter.

The method of mathematically structuring and factoring the desired filter function into a mathematical function yielding a minimized logic implementation derives, in part, from the realization that advantage may be taken of relaxing certain filter characteristics to achieve simplification in implementing the filter function. However, such mathematical structuring is constrained by the desired performance requirements of the filter and the consequent need to maintain particular characteristics invariant during the factoring process. In the video processing application for which the FIG. 1A converter is intended, filter 40 is desired to minimize alias components in the Passband (ideally to less than 50 dB) whilst also maintaining low complexity (measured in number of adders required for the filter 40 implementation). Normally performance and complexity are inverse relationships in filter design (an interpolator can be viewed as a programmable filter). However, both objectives may be met by structurally factoring a mathematical interpolation function as disclosed herein to yield an optimally minimized circuit implementation of a desired filter function that is tightly tied to the mathematical structure of the desired filter function.

Figure 6:
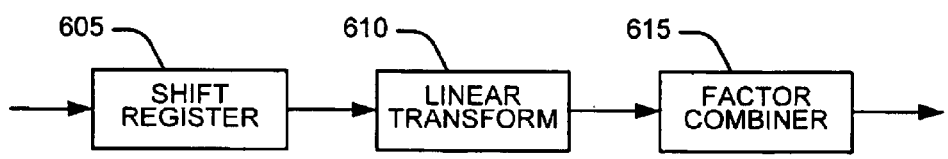
FIG. 6 shows the principal elements of a structural factoring process used to derive improved digital filter functions, according to the principles of the invention.

FIG. 6 shows the principal elements of a structural factoring process used to derive improved digital filter functions. The structural factoring process comprises structuring a mathematical expression representing a filter function into a form that maps into a linear sequence of operations that are readily implementable in logic (i.e. adders, multipliers and latches). The factoring process of FIG. 6 comprises determining delay (e.g. achieved using a shift register), linear transformation and factor combination processes (steps 605, 610 and 615 respectively). The structural factoring steps 605, 610 and 615 are described as follows.

1. The shift register process 605 comprises representing an interpolator's output in column vector form, $$S^k = \{z^{-k}, k=0 \ldots M\} = \text{transpose}([1, z^{-1}, z^{-2}, \ldots, z^{-M}]),$$

where the interpolator's output at any one time is a function of M+1 contiguous input samples.

2. The linear transform process 610 comprises representing series and parallel connections of a multi-input multi-output filter network as both a single matrix, $L_k^i$ (where i is row index (superscript), k is column index (subscript)), and products and sums of matrices. It is through decomposing the single matrix $L_k^i$ into a matrix expression that an optimally minimized filter hardware implementation (in terms of latches, adders and multipliers) is achieved.

3. The factor combiner process of step 615 derives the filter 40 (FIG. 1A) output by calculating a weighted sum of the N outputs ("factors") of the linear transform process of step 610. For the converter of FIG. 1A the factor combiner is constrained to employ a single parameter u representing interpolate spatial position by the row vector, $$U_i = \{u^{-i}, i=0 \ldots M\} = [1, u, u^2, \ldots, u^{(N-1)}]$$

Given the conditions that, u=0 corresponds to a delay of half way between two input samples, u is within (−0.5,0.5), and M is odd, then matrix $L_k^i$ has the following properties; odd rows are coefficient symmetric and even rows are coefficient anti-symmetric. An $L_k^i$ matrix for a four tap filter (M=3) comprising filter 40 of FIG. 1A that provides a minimum alias solution for 0 to 0.6 of the Nyquist folding frequency, is closely approximated with the integer matrix:

$$L_k^i = \frac{\begin{bmatrix} 6 & 58 & 58 & 6 \\ 23 & 59 & -59 & -23 \\ 31 & -31 & -31 & 31 \\ 16 & -48 & 48 & -16 \end{bmatrix}}{128}$$

The number of adders ($\#L_k^i$) required to implement each constant are $$\#L_k^i = \begin{bmatrix} 1 & 2 & 2 & 1 \\ 2 & 2 & 2 & 2 \\ 1 & 1 & 1 & 1 \\ 0 & 1 & 1 & 0 \end{bmatrix},$$

Plus 12 adders for accumulation

A direct implementation of this filter would take 32 adders but taking advantage of individual row symmetries could reduce this to 21 adders. However, by applying the structural factoring method and decomposing the single matrix $L_k^i$ into a matrix expression, further minimization in filter hardware is achieved. Such structural factoring takes advantage of the existence of a factor comprising a sparse matrix in matrix $L_k^i$ that results from matrix row symmetries. A sparse matrix is a matrix containing multiple zero value elements. While the constants that fill this sparse matrix are dependent upon a particular matrix L, it is the row coefficient symmetry imposed upon $L_k^i$ that ensures that a sparse matrix factor with at least half of its entries of zero value exists. Many solutions with this form exist for a specific $L_k^i$. One of minimal implementation complexity is constructed as follows. The filter 40 matrix $L_k^i$ is structurally factored to provide:

$$L_k^i = \frac{\begin{bmatrix} 64 & 0 & 6 & 0 \\ 0 & 128 & 0 & 23 \\ 0 & 0 & 31 & 0 \\ 0 & 0 & 0 & 16 \end{bmatrix}}{128} \cdot \begin{bmatrix} 0 & 1 & 1 & 0 \\ 0 & 1 & -1 & 0 \\ 1 & -1 & -1 & 1 \\ 1 & -3 & 3 & -1 \end{bmatrix}$$

$\#L_k^i = (0+0+2+2) + 2_{acc} + (0+1+1+0) + 8_{acc} = 16$ adder (Where $\#L_k^i$ is the number adders required for implementation).

Therefore, structural factoring yields a 50% reduction in the number of adders required for this factored implementation in comparison to the direct implementation (i.e. 16 adders are required vs. 32 adders). Filter 40 of FIG. 1A implements this structurally factored solution which represents the function:

$H(DC) = 1,$ $H_{4tap}(z) =$ $$[1 \; \mu \; \mu^2 \; \mu^3] \cdot \begin{bmatrix} \frac{1}{2} & 0 & \frac{3}{64} & 0 \\ 0 & 1 & 0 & \frac{23}{128} \\ 0 & 0 & \frac{31}{128} & 0 \\ 0 & 0 & 0 & \frac{1}{8} \end{bmatrix} \cdot \begin{bmatrix} 0 & 1 & 1 & 0 \\ 0 & 1 & -1 & 0 \\ 1 & -1 & -1 & 1 \\ 1 & -3 & 3 & -1 \end{bmatrix} \begin{bmatrix} 1 \\ z^{-1} \\ z^{-2} \\ z^{-3} \end{bmatrix}$$

ASSEMBLY FUNCTIONS        BASIS FIRs $\mu \in [-.5, .5]$

Filter 40 advantageously implements this minimized structurally factored function to provide the FIG. 1A sample rate converter output whilst processing data at a single data rate (the desired output sampling rate). It is implemented with three multipliers (units 43, 46 and 49) and 16 adders (units 51–81) and 39 latches as depicted in FIG. 1A. This filter function provides improved performance in terms of reducing passband alias components (critical for video processing type applications) in comparison with a conventional function. The improved performance is achieved with reduced circuit hardware cost and complexity. The structural factoring method is also applicable for optimizing and minimizing of other digital filter functions for sample rate converter and other uses.

The structurally factored filter function of unit 40 (and other filter functions) may be further simplified by taking advantage of other row properties. This may be done in the function of filter 40, for example, by making use of an additional matrix factor and by decomposing matrix $L_k^i$ into the following.

$$L_k^i = \frac{\begin{bmatrix} 64 & 0 & 6 & 0 \\ 0 & 128 & 0 & 23 \\ 0 & 0 & 31 & 0 \\ 0 & 0 & 0 & 16 \end{bmatrix}}{128} \cdot \begin{bmatrix} 0 & 1 & 1 & 0 \\ [1 \; -1] \otimes \begin{bmatrix} 0 & 1 & 0 \\ 1 & 0 & -1 \\ 1 & -2 & 1 \end{bmatrix} \end{bmatrix}$$

$\#L_k^i = (0+0+2+2) + 2_{acc} + (0+0+0+0) + 5_{acc} = 11$ Adders (Where $\#L_k^i$ is the number adders required for implementation).

Therefore, further structural factoring yields a 66% reduction in the number of adders required for this factored implementation in comparison to the direct implementation (i.e. 11 adders are required vs. 32 adders).

Figure 2:
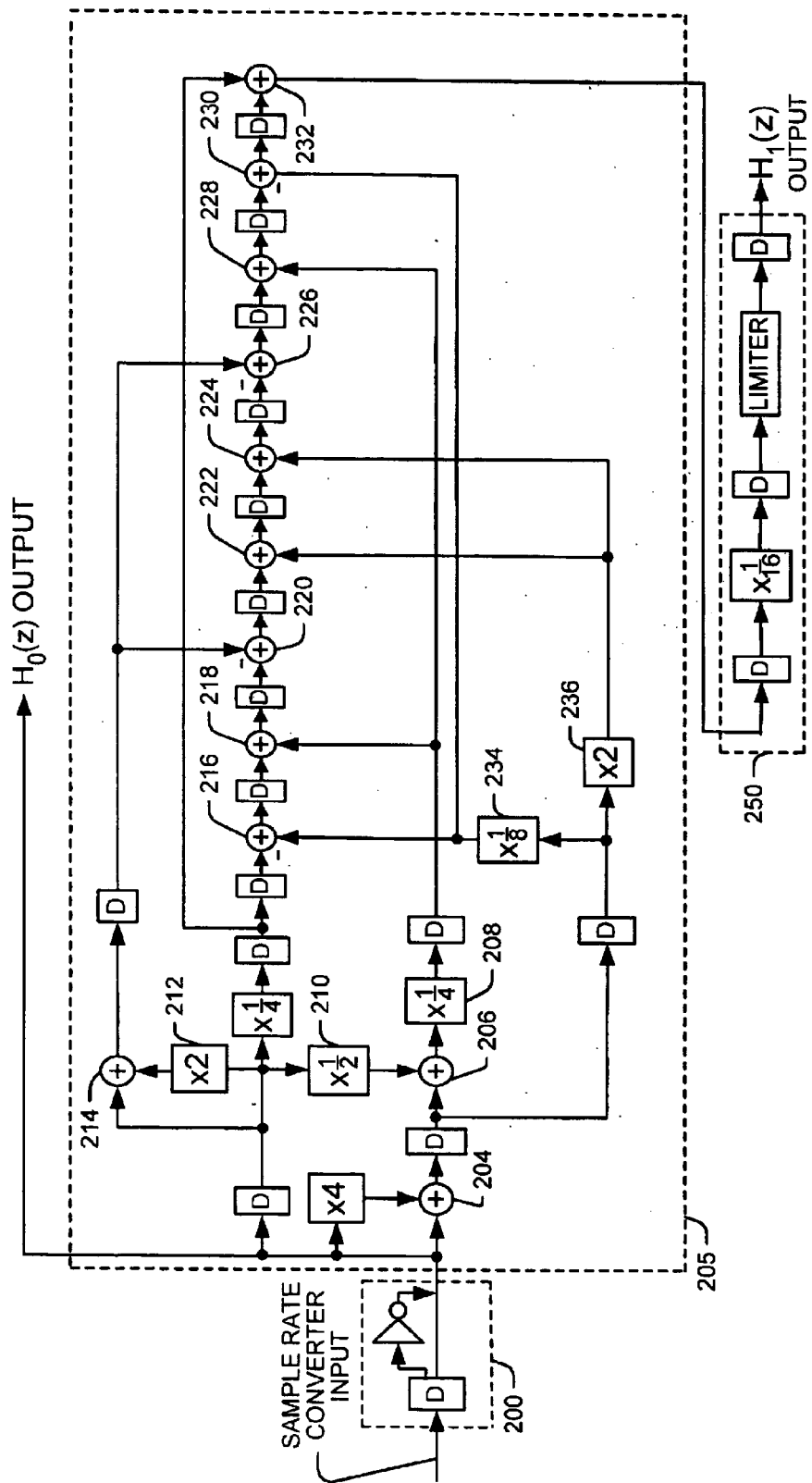
FIG. 2 shows a filter configuration suitable for providing the $H_1(z)$ and $H_0(z)$ outputs of the first interpolation network stage bootstrap filter of unit 10 of FIG. 1, according to the invention.

FIG. 2 shows a filter configuration suitable for providing the $H_1(z)$ and $H_0(z)$ outputs of the first interpolation network stage (bootstrap filter) of units 13 and 15 within unit 10 of FIG. 1. As previously mentioned, function $H_0(z)$ is merely a pass-through identity function ($H_0(z) = z$) whereby input pre-filtered data (from unit 17 of FIG. 1) is buffered in unit 200 of FIG. 2 before being provided to delay network 20 (FIG. 1). The FIG. 2 interpolator function $H_1(z)$ interpolates the input sampled data after buffering by unit 200 to provide intervening data samples intermediate between the input samples from unit 17. The $H_1(z)$ interpolator function, comprising adders (units 204, 206 and 214–232), scalers (units 202, 208, 210, 212, 234 and 236) and output stage 250. The $H_1(z)$ function is shown as follows.

$$H_1(z) = \frac{2 - 5z^{-1} + 11z^{-2} - 24z^{-3} + 80z^{-4} + 80z^{-5} - 24z^{-6} + 11z^{-7} - 5z^{-8} + 2z^{-9}}{128}$$

The resultant outputs of the $H_0(z)$ and $H_1(z)$ functions, provided by the FIG. 2 arrangement, comprise interpolated data samples upsampled by a factor of two in comparison with the input data.

Figure 3:
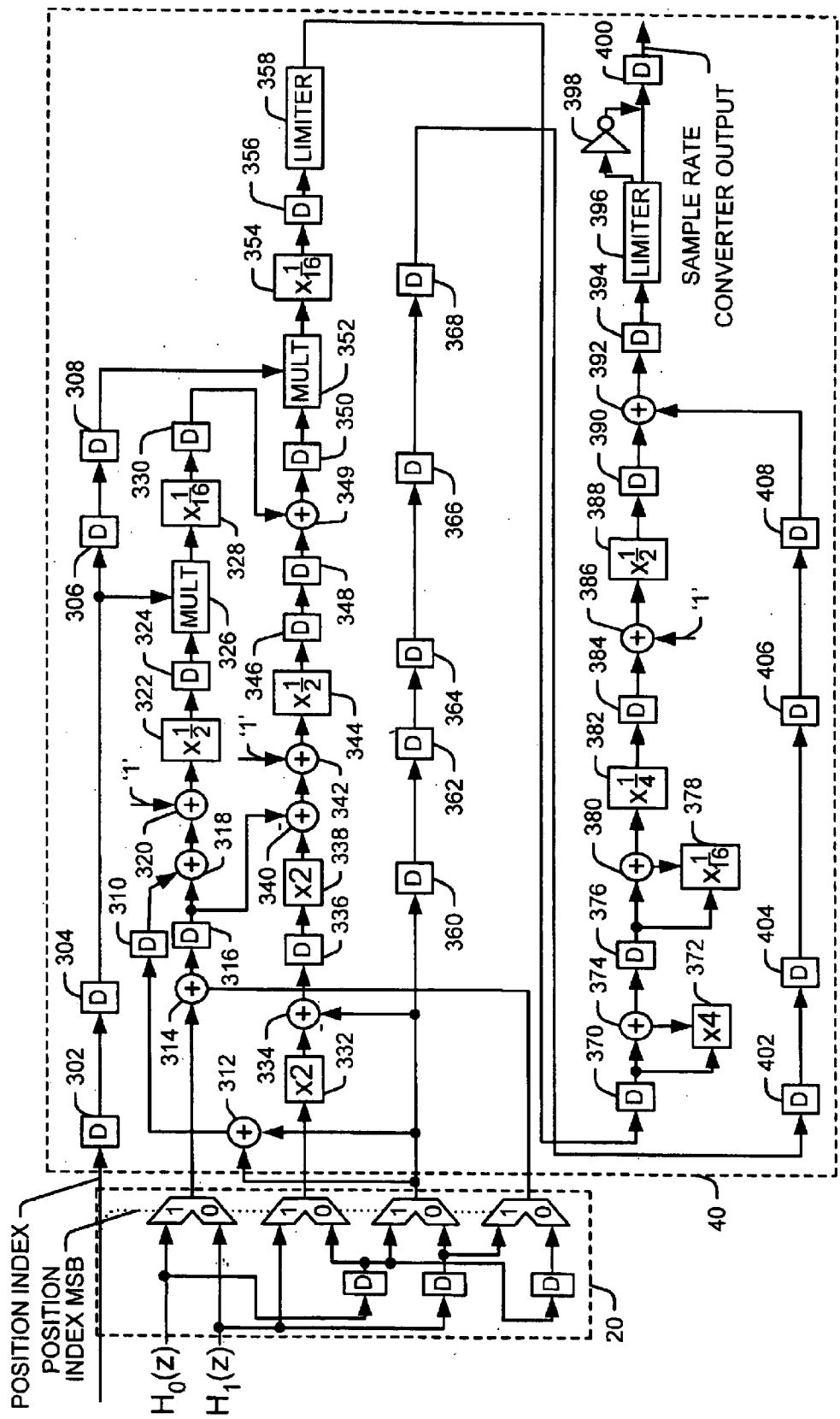
FIG. 3 shows a reduced complexity digital filter for use as digital filter 40 in the sample rate converter configuration of FIG. 1, according to the principles of the invention.

FIG. 3 is an example of an advantageous reduced complexity filter (in comparison to the high performance filter of unit 40 of FIG. 1A) that may alternatively be used in the sample rate converter configuration of unit 40 of FIG. 1. The filter of FIG. 3 employs nine adders (units 312, 314, 318, 334, 340, 349, 374, 380 and 392) and two multipliers (units 326 and 352) plus a plurality of D-type register delay stages and scaling and other stages. (Note, units 320, 342 and 386 are not counted as adders for circuit purposes as they merely add a digital one value and may be implemented without additional adder elements). The filter of FIG. 3 is used for interpolation and may be used to perform a wide range of sample rate conversions. The filter of FIG. 3 does this by calculating the closest interpolate value to each value at a required output spatial position using a ×32 spatial upsampling output grid. The filter of FIG. 3 implements the following interpolation function.

$$H_{4tap}(z) = [\,1\;\;\mu\;\;\mu^2\,] \cdot \frac{\begin{bmatrix} 0 & 0 & 3 & 0 \\ -1 & 4 & -2 & -1 \\ 1 & -1 & -1 & 1 \end{bmatrix}}{3} \cdot \begin{bmatrix} 1 \\ z^{-1} \\ z^{-2} \\ z^{-3} \end{bmatrix},\; H(DC)=1$$

The structural factoring method may be applied to this function to decompose the single matrix $L_k^i$ into a matrix product expression and obtain further minimization in filter hardware. Such structural factoring takes advantage of the existence of a factor comprising a sparse matrix in matrix $L_k^i$ that results from matrix row symmetries. Applying the structural factoring method to take advantage of row symmetries and sparse matrix factor, the following function is derived.

$$H_{4tap}(z) = [\,1\;\;\mu\;\;\mu^2\,] \cdot \begin{bmatrix} 1 & 0 & 0 \\ 0 & 1 & -1 \\ 0 & 0 & 1 \end{bmatrix} \cdot$$

$$\begin{bmatrix} 1 & 0 & 0 \\ 0 & 1 & 0 \\ 0 & 0 & \frac{1}{3} \end{bmatrix} \cdot \begin{bmatrix} 0 & 0 & 1 & 0 \\ [1-1] \otimes \begin{bmatrix} 0 & 1 & 0 \\ 1 & 0 & -1 \end{bmatrix} \end{bmatrix} \cdot \begin{bmatrix} 1 \\ z^{-1} \\ z^{-2} \\ z^{-3} \end{bmatrix},$$

$H(DC) = 1$ 1 adder + 2 adder + 2 adder = 5 adder Linear Transform

This advantageous configuration of the FIG. 3 filter function may be implemented with three less adders than the non-structurally factored version. This represents a significant saving in the required circuit hardware.

FIG. 4 shows a table indicating coefficient values and effective filter delay in conjunction with the corresponding position index signal for the reduced complexity digital filter of unit 40 of FIG. 3. FIG. 4 lists the coefficient values, effective filter delay values and position index values for each of the 32 spatial sample positions used by the FIG. 3 interpolation filter in its ×32 spatial upsampling output grid. The position index data 420 (in the first column of FIG. 4) is used by filter 40 to spatially interpolate between two input samples being processed. The position index signal 420 controls the phase of filter 40 on a pixel by pixel basis. It does this through multipliers 326 and 352 (via delays 302–308 of FIG. 3) and by selecting between two sets of delayed upsampled interpolated data samples encompassing a corresponding original sample position via the multiplexers of unit 20 (FIG. 3).

The delay data 425 in the second column of FIG. 4 shows the actual effective delay through filter 40. The delay values range from 48/32 (FIG. 4 column 425 item 0) to 17/32 (FIG. 4 column 425 item 31). Individual delay values are expressed as a fraction of the input sample period and consequently range from 1.5 to approximately 0.5 input samples in duration. The delay data 425 shows the actual effective delay through filter 40 corresponding to each of the two sets of delayed upsampled interpolated data samples being processed. Selection between the two sets of delayed upsampled interpolated data samples being processed and the corresponding filter 40 delay is determined by position index signal 420. The processing of the first set of delayed upsampled interpolated data samples from the multiplexers of unit 20 (FIG. 3) involves data items 425–445 presented in the first 16 shaded spatial interpolation positions (position index 420-items 0–15) of FIG. 4. The processing of the second set of delayed upsampled interpolated data samples from the unit 20 multiplexers (FIG. 3) involves data items 425–445 presented in the second 16 non-shaded spatial interpolation positions (position index 420-items 16–31) of FIG. 4.

The next four columns 430–445 of FIG. 4 show the effective weighting coefficients of the four taps of the converter of FIG. 3. The first two of these columns 430 and 435 (1 for no delay, and $z^{-0.5}$ for a one half clock delay) actually show the values of the gain produced by coefficients C0 and C1 of the FIG. 3 interpolation filter. The last two columns 440 and 445 ($z^{-1}$—a one clock delay, and $z^{-1.5}$—a one and one half clock delay) show the gains for the last coefficient C2 and C3 stages. Note that these are effective coefficients and cannot be individually localized in the hardware.

Figure 5:
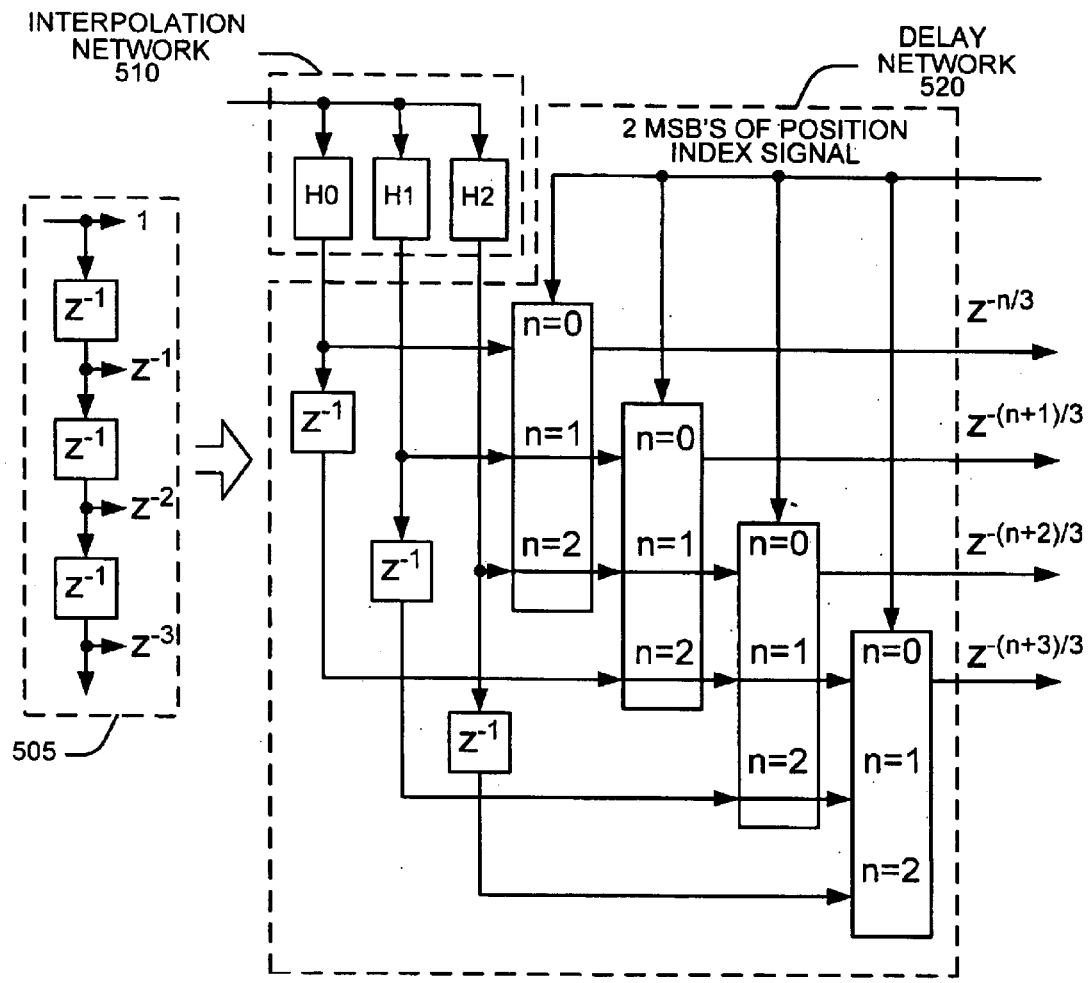
FIG. 5 shows an arrangement exemplifying extension of the interpolation network (unit 10) and delay network (unit 20) of FIG. 1 to provide enhanced interpolator performance, according to the principles of the invention.

FIG. 5 shows an arrangement exemplifying extension of the interpolation network (unit 10) and delay network (unit 20) of FIG. 1 to provide enhanced interpolator performance. Specifically, FIG. 5 shows how the generalized delay network of units 10 and 20 of FIG. 1 may be replaced by corresponding interpolation network 510 and delay network 520 to provide higher resolution interpolation. FIG. 5 also shows how virtually any tapped delay line (e.g. delay line 505) used in any digital filter or sample rate converter system, for example, may be replaced by the advantageous generalized delay line exemplified by units 10 and 20 of FIG. 1 and units 510 and 520 of FIG. 5. Such replacement yields improvements including (a) increasing the proportion of sample rate converter circuitry operating at the input sample rate, and (b) enabling a consequent reduction in the number of data rates required by sample rate converter system. In the system of FIG. 1, for example, data may be processed at two data rates (the input sample rate and the desired output sample rate). This eliminates the need for processing data at an intermediate data rate as is typically required by a system using the conventional delay line 505 (FIG. 5) configuration.

In the generalized delay line of FIG. 5, interpolation network 510 comprises digital FIR filters H0, H1, H2 having respective impulse responses that provide three distinct output signals each with a sample spacing equal to the input sample spacing. However, the three output signals from filters H0, H1 and H2 are phase shifted with respect to each other and together represent an upsampling of the input signal by a factor of three. The three output signals from units H0, H1 and H2 of unit 510 are multiplexed by delay network 520 to providing multiple $$\frac{T}{n}$$

spaced delay line outputs (taps) comprising higher resolution sampled data surrounding the output sample time desired, where T is the period between samples of the input sample rate and n=3.

The four multiplexers of network 520 multiplex between the two sets of upsampled delayed inputs from filters H0, H1 and H2 of unit 510 in response to the two most significant bits of the position index input signal (described in connection with FIGS. 1 and 4). The two most significant bits identify the sample set from unit 510 that spatially encompass the position of the converter output sample currently being determined. Specifically, the two most significant bits identify and select the sample set comprising the two upsampled delayed output samples located either side of the output sample being determined.

The architectures of FIGS. 1–3 and 5 are not exclusive. Other architectures may be derived in accordance with the principles of the invention to accomplish the same objectives. In addition, a wide variety of advantageous filter functions may be derived using the disclosed structural factoring method for decomposing filter coefficient matrix expressions. Further, the generalized delay line concept may be used to provide cost-effective universal, flexible sample rate conversion from an input sample rate to virtually any output sample rate.

The disclosed sample rate converter and filter functions may be implemented in whole or in part within the programmed instructions of a microprocessor or other controller. Also, the inventive principles disclosed may be used for any filtering or sample rate converter application including, for example, conversion between different video standards, multi-media composite image formation, data processing for digital data storage such as for CDROM or DVD applications and digital demodulation.

What is claimed is:

1. A digital filter for filtering sample data, comprising:
   a delay network for delaying input sample data to provide a plurality of delayed sample data outputs;
   a filter network representable by a decomposed coefficient weighting matrix for processing said delayed sample data outputs; and
   a processor for producing a filtered output by computing a weighted product summation of said delayed sample data outputs and said coefficient weighting matrix, said processor being responsive to a sample spatial position index signal in producing said filtered output.

2. A digital filter according to claim 1, wherein said decomposed coefficient weighting matrix comprises a structurally factored matrix.

3. A digital filter according to claim 2, wherein said structurally factored matrix employs a factor derived based on a property including at least one of, (a) coefficient matrix row symmetry, and (b) coefficient matrix column symmetry.

4. A digital filter according to claim 1, wherein said decomposed coefficient weighting matrix is derived by at least one of (a) factoring a first coefficient weighting matrix with a common row factor, and (b) factoring a first coefficient weighting matrix based on at least one of, (i) coefficient matrix row symmetry, and (ii) coefficient matrix column symmetry.

5. A digital filter according to claim 1, wherein said decomposed coefficient weighting matrix is derived by factoring a first coefficient weighting matrix using a sparse matrix.

6. A digital filter according to claim 1, wherein said decomposed coefficient weighting matrix represents a multiple input, multiple output, filter network.

7. A digital filter according to claim 1, including an interpolation network for interpolating sample data to provide said input sample data.

8. A digital filter according to claim 1, wherein said processor includes a factor combiner for deriving a weighted sum of factors representing a linear transform process.

9. A digital filter according to claim 1, wherein said decomposed coefficient weighting matrix exhibits the form $$\frac{\begin{bmatrix} 0 & 0 & 3 & 0 \\ -1 & 4 & -2 & -1 \\ 1 & -1 & -1 & 1 \end{bmatrix}}{3}.$$

10. A digital filter according to claim 1, wherein said digital filter provides the function $$H(z) = \begin{bmatrix} 1 & \mu & \mu^2 \end{bmatrix} \cdot \frac{\begin{bmatrix} 0 & 0 & 3 & 0 \\ -1 & 4 & -2 & -1 \\ 1 & -1 & -1 & 1 \end{bmatrix}}{3} \cdot \begin{bmatrix} 1 \\ z^{-1} \\ z^{-2} \\ z^{-3} \end{bmatrix}$$

where u is a sample spatial position representative signal and z represents an input sample.

11. A digital filter according to claim 1, wherein said decomposed coefficient weighting matrix exhibits the form $$\frac{\begin{bmatrix} 6 & 58 & 58 & 6 \\ 23 & 59 & -59 & -23 \\ 31 & -31 & -31 & 31 \\ 16 & -48 & 48 & -16 \end{bmatrix}}{128}.$$

12. A digital filter according to claim 1, wherein said digital filter provides the following function, where u is a sample spatial position representative signal and z presents an input sample $$H(z) = \begin{bmatrix} 1 & \mu & \mu^2 & \mu^3 \end{bmatrix} \cdot \begin{bmatrix} \frac{1}{2} & 0 & \frac{3}{64} & 0 \\ 0 & 1 & 0 & \frac{23}{128} \\ 0 & 0 & \frac{31}{128} & 0 \\ 0 & 0 & 0 & \frac{1}{8} \end{bmatrix} \cdot \begin{bmatrix} 0 & 1 & 1 & 0 \\ 0 & 1 & -1 & 0 \\ 1 & -1 & -1 & 1 \\ 1 & -3 & 3 & -1 \end{bmatrix} \cdot \begin{bmatrix} 1 \\ z^{-1} \\ z^{-2} \\ z^{-3} \end{bmatrix}$$

13. A method for filtering sample data, comprising the steps of:
   delaying input sample data to provide a plurality of delayed sample data outputs;
   processing said delayed sample data outputs using a filter network represented by a structurally factored coefficient weighting matrix, said structurally factored matrix comprising a coefficient weighting matrix employing factors derived based on a property including at least one of, (a) coefficient matrix row symmetry, and (b) coefficient matrix column symmetry; and
   producing a filtered output by computing a weighted product summation of said delayed sample data outputs and said coefficient weighting matrix.

14. A method for filtering sample data, comprising the steps of:
- delaying input sample data to provide a plurality of delayed sample data outputs;
- processing said delayed sample data outputs using a filter network represented by a structurally factored coefficient weighting matrix, said structurally factored matrix being derived by at least one of (a) factoring a first coefficient weighting matrix with a common row factor, and (b) factoring a first coefficient weighting matrix based on a property including at least one of, (i) coefficient matrix row symmetry, and (ii) coefficient matrix column symmetry; and
- producing a filtered output by computing a weighted product summation of said delayed sample data outputs and said coefficient weighting matrix.

15. A method for filtering sample data, comprising the steps of:
- delaying input sample data to provide a plurality of delayed sample data outputs;
- processing said delayed sample data outputs using a filter network represented by a structurally factored coefficient weighting matrix, said structurally factored matrix comprising a decomposed coefficient weighting matrix derived by factoring a first coefficient weighting matrix using a sparse matrix; and
- producing a filtered output by computing a weighted product summation of said delayed sample data outputs and said coefficient weighting matrix.

16. A method for filtering sample data, comprising the steps of:
- delaying input sample data to provide a plurality of delayed sample data outputs;
- processing said delayed sample data outputs using a filter network using a coefficient weighting matrix comprising, $$\frac{\begin{bmatrix} 0 & 0 & 3 & 0 \\ -1 & 4 & -2 & -1 \\ 1 & -1 & -1 & 1 \end{bmatrix}}{3}; \text{ and}$$

- producing a filtered output by computing a weighted product summation of said delayed sample data outputs and said coefficient weighting matrix.

17. A method for filtering sample data, comprising the steps of:
- delaying input sample data to provide a plurality of delayed sample data outputs;
- processing said delayed sample data outputs using a filter network using a coefficient weighting matrix comprising, $$\frac{\begin{bmatrix} 6 & 58 & 58 & 6 \\ 23 & 59 & -59 & -23 \\ 31 & -31 & -31 & 31 \\ 16 & -48 & 48 & -16 \end{bmatrix}}{128}; \text{ and}$$

- producing a filtered output by computing a weighted product summation of said delayed sample data outputs and said coefficient weighting matrix.

* * * * *